(12) United States Patent
Scheuerlein

(10) Patent No.: US 7,830,722 B2
(45) Date of Patent: *Nov. 9, 2010

(54) FLOATING BODY MEMORY CELL SYSTEM AND METHOD OF MANUFACTURE

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 131 days.

This patent is subject to a terminal disclaimer.

(21) Appl. No.: 11/923,713

(22) Filed: Oct. 25, 2007

(65) Prior Publication Data

US 2009/0116270 A1 May 7, 2009

Related U.S. Application Data

(62) Division of application No. 11/157,293, filed on Jun. 20, 2005.

(51) Int. Cl.
*G11C 11/34* (2006.01)
(52) U.S. Cl. .............................. 365/185.26; 365/185.01; 365/185.13
(58) Field of Classification Search ............ 365/185.26, 365/185.01, 185.13
See application file for complete search history.

(56) References Cited

U.S. PATENT DOCUMENTS

| | | | |
|---|---|---|---|
| 4,574,365 A | 3/1986 | Scheuerlein | |
| 5,268,870 A | 12/1993 | Harari | |
| 5,474,365 A | 12/1995 | Von Linsingen-Heintzmann | |
| 5,915,167 A | 6/1999 | Leedy | |
| 6,034,882 A | 3/2000 | Johnson et al. | |
| 6,185,122 B1 | 2/2001 | Johnson et al. | |
| 6,490,218 B1 | 12/2002 | Vyvoda et al. | |
| 6,504,753 B1 | 1/2003 | Scheuerlein et al. | |
| 6,522,594 B1 | 2/2003 | Scheuerlein | |
| 6,573,545 B2 * | 6/2003 | Kim et al. ................... 257/296 |
| 6,618,295 B2 | 9/2003 | Scheuerlein | |
| 6,631,085 B2 | 10/2003 | Kleveland et al. | |
| 6,633,509 B2 | 10/2003 | Scheuerlein et al. | |
| 6,661,730 B1 | 12/2003 | Scheuerlein et al. | |
| 6,686,624 B2 | 2/2004 | Hsu | |

(Continued)

FOREIGN PATENT DOCUMENTS

WO   WO 2004/090905   10/2001

(Continued)

OTHER PUBLICATIONS

Written Opinion and International Search Report of International Application No. PCT/US2006/023707 dated Feb. 5, 2007.

(Continued)

*Primary Examiner*—Son Dinh
*Assistant Examiner*—Nam Nguyen
(74) *Attorney, Agent, or Firm*—Dugan & Dugan, PC

(57) ABSTRACT

A plurality of integrated circuit features are provided in the context of an array of memory cells including a plurality of word lines and a plurality of bit lines. Each memory cell includes a floating body or is volatile memory. The aforementioned features may include, among others, an option whereby the foregoing bit lines may be situated below a channel region of corresponding memory cells, etc.

25 Claims, 13 Drawing Sheets

U.S. PATENT DOCUMENTS

| | | | |
|---|---|---|---|
| 6,735,104 | B2 | 5/2004 | Scheuerlein |
| 6,754,102 | B2 | 6/2004 | Kleveland et al. |
| 6,768,685 | B1 | 7/2004 | Scheuerlein |
| 6,816,410 | B2 | 11/2004 | Kleveland et al. |
| 6,822,903 | B2 | 11/2004 | Scheuerlein et al. |
| 6,856,572 | B2 | 2/2005 | Scheuerlein et al. |
| 6,859,410 | B2 | 2/2005 | Scheuerlein et al. |
| 6,920,060 | B2 * | 7/2005 | Chow et al. ............... 365/145 |
| 6,998,677 | B1 | 2/2006 | Fastow |
| 7,177,191 | B2 * | 2/2007 | Fasoli et al. ............ 365/185.17 |
| 7,221,588 | B2 | 5/2007 | Fasoli et al. |
| 7,233,522 | B2 | 6/2007 | Chen et al. |
| 7,317,641 | B2 | 1/2008 | Scheuerlein |
| 7,319,617 | B2 * | 1/2008 | Park ..................... 365/185.25 |
| 7,348,618 | B2 | 3/2008 | Woo et al. |
| 2002/0022360 | A1 | 2/2002 | Kim et al. |
| 2002/0028541 | A1 | 3/2002 | Lee et al. |
| 2002/0105057 | A1 | 8/2002 | Vyvoda et al. |
| 2003/0081489 | A1 | 5/2003 | Scheuerlein et al. |
| 2004/0007721 | A1 | 1/2004 | Forbes et al. |
| 2004/0100831 | A1 | 5/2004 | Knall et al. |
| 2004/0124415 | A1 | 7/2004 | Walker et al. |
| 2004/0125629 | A1 | 7/2004 | Scheuerlein et al. |
| 2004/0155317 | A1 | 8/2004 | Bhattacharyya |
| 2004/0188714 | A1 | 9/2004 | Scheuerlein et al. |
| 2004/0263238 | A1 | 12/2004 | Thorp et al. |
| 2005/0047240 | A1 | 3/2005 | Ikehashi et al. |
| 2005/0078537 | A1 | 4/2005 | So et al. |
| 2005/0088895 | A1 | 4/2005 | Manger et al. |
| 2006/0285422 | A1 | 12/2006 | Scheuerlein |

FOREIGN PATENT DOCUMENTS

| | | |
|---|---|---|
| WO | WO 2004/061861 | 7/2004 |
| WO | WO 2004/061863 | 7/2004 |

OTHER PUBLICATIONS

Notice of Allowance and Fee(s) Due of U.S. Appl. No. 11/157,293 dated Dec. 26, 2007.

Notice of Allowance and Fee(s) Due of U.S. Appl. No. 11/157,293 dated Jan. 27, 2009.

Notice of Allowance and Fee(s) Due of U.S. Appl. No. 11/157,293 dated May 14, 2009.

Office Action of U.S. Appl. No. 11/157,293 dated May 9, 2008.

Office Action of U.S. Appl. No. 11/157,293 dated Jun. 13, 2007.

Nov. 10, 2008 Reply to May 9, 2008 Office Action of U.S. Appl. No. 11/157,293.

Nov. 15, 2007 Supplemental Reply to Jun. 13, 2007 Office Action of U.S. Appl. No. 11/157,293.

Nov. 1, 2007 Reply to Jun. 13, 2007 Office Action of U.S. Appl. No. 11/157,293.

Ohsawa et al., "An I 8.5ns 128 Mb SOI DRAM with a Floating Body Cell", Solid-State Circuits Conference, 2005. Digest of Technical Papers. ISSCC. 2005 IEEE International, vol. Feb. 9, 2005, pp. 458-695.

Ohsawa et al., "Memory Design Using One-Transistor Gain Cell on SOI", Solid-State Circuits Conference, 2002. Digest of Technical Papers. ISSCC. 2002 IEEE International, vol. I, Feb. 3-7, 2002, pp. 152-455.

Ohsaki et al., "A Single Poly EEPROM Cell Structure for Use in Standard CMOS Processes", IEEE Journal of Solid-State Circuits, vol. 29, No. 3, Mar. 1994.

Ohsawa et al., "Memory Design Using a One-Transistor Gain Cell on SOI", Nov. 2002, IEEE Journal of Solid-State Circuits, vol. 37, No. 11, pp. 1510-1522.

Tanaka et al., "Scalability Study on a Capacitorless IT-DRAM: From Single-gate PD-SOI to Double-gate FinDRAM", 2004, IEEE, pp. 37.5.1-37.5.4.

Office Action of U.S. Appl. No. 11/157,293 mailed Oct. 15, 2009.

Jan. 15, 2010 Reply to Office Action of related U.S. Appl. No. 11/157,293 mailed Oct. 15, 2009.

Notice of Allowance of related U.S. Appl. No. 11/157,293 mailed Mar. 8, 2010.

Supplemental Notice of Allowance of related U.S. Appl. No. 11/157,293 dated Mar. 30, 2010.

* cited by examiner

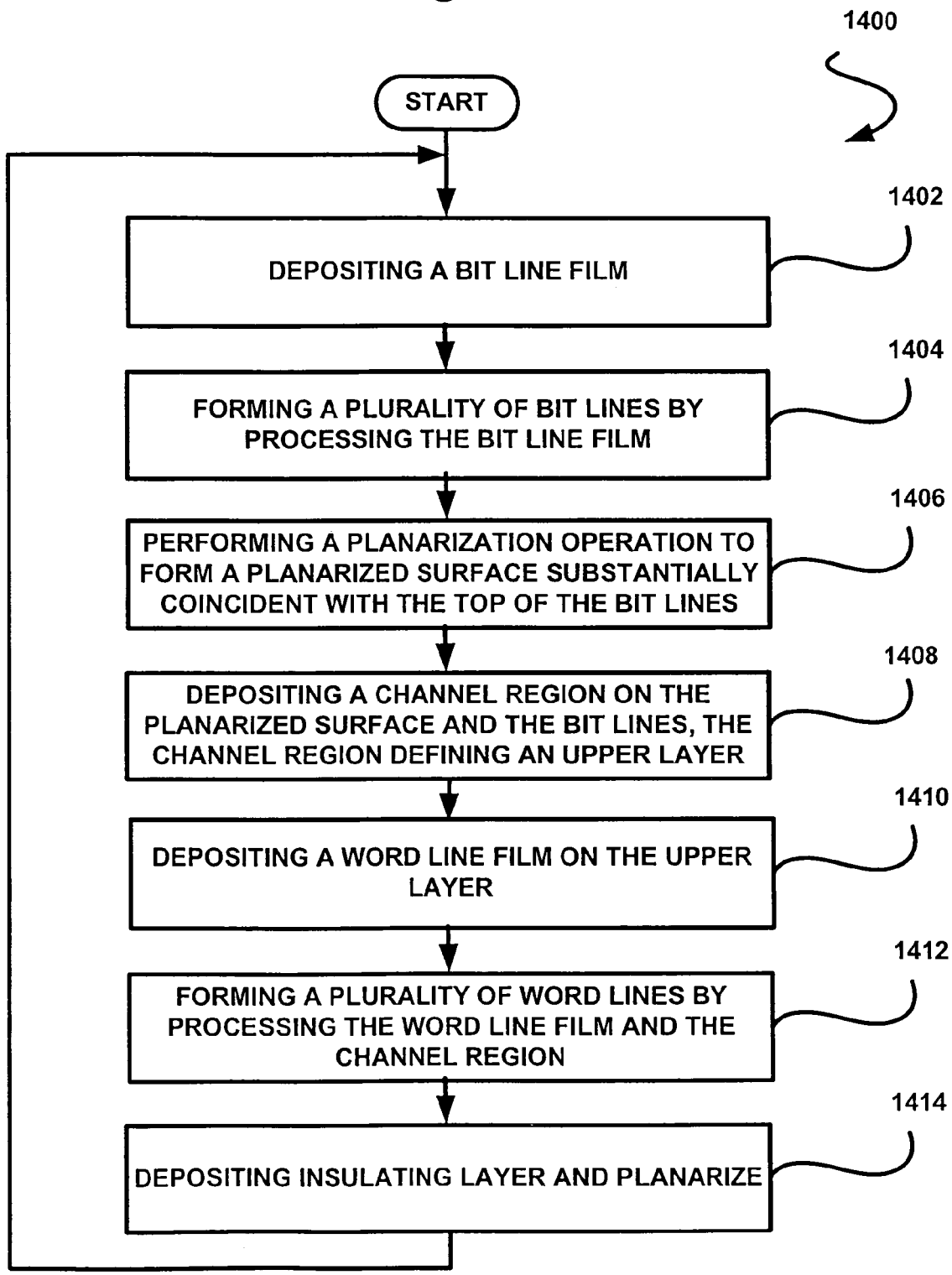

US 7,830,722 B2

FLOATING BODY MEMORY CELL SYSTEM AND METHOD OF MANUFACTURE

BACKGROUND AND FIELD OF THE INVENTION

The present invention relates to memory devices, and more particularly to memory arrays embodied on integrated circuits.

SUMMARY

A plurality of integrated circuit features are provided in the context of an array of memory cells including a plurality of word lines and a plurality of bit lines. Each memory cell includes a floating body or even a writeable floating body, and/or is volatile memory.

In some embodiments, a three-dimensional array of the memory cells may be provided. In embodiments employing such three-dimensional array of memory cells, more than one level of the word lines and/or more than one level of the bit lines may be included.

In one embodiment, each memory cell may include a channel region in which the floating body resides. Further, the bit lines may be situated below the channel region of corresponding memory cells.

In another embodiment, the floating body of each memory cell may have current flowing therethrough. In such embodiment, the bit lines may extend in a first direction that is different from a second direction in which the current flows through the floating body of corresponding memory cells. For example, the first direction may be perpendicular to the second direction. As yet another option, the word lines may be disposed in a third direction, where the second direction is parallel with the third direction.

In still yet another embodiment, the array of memory cells may include a plurality of common lines corresponding to the bit lines. In such embodiment, the bit lines extend in a first direction that is parallel to a second direction in which the corresponding common lines extend.

In a self-aligned embodiment, each memory cell may include at least one diffusion region and at least one channel region. To this end, borders between the at least one diffusion region and the at least one channel region may be self-aligned to a corresponding bit line.

In a recrystallization embodiment, at least a portion of the floating body may include a recrystallized semiconductor material. In still yet another embodiment, the memory cells are capable of storing a charge to indicate a memory state and substantially retaining such charge during a read operation.

In the context of yet additional embodiments, at least one of the bit lines corresponding to the floating body may be situated at a first side with respect to the floating body and at least one of the word lines corresponding to the floating body may be situated at a second side with respect to the floating body.

In still yet another embodiment, where volatile memory cells include thin-film transistor (TFT) devices each with a source and a drain each formed as a rail, three adjacent memory cells which are associated with one of the word lines may be further associated with less than five of the rails. Further, in a similar embodiment, four adjacent memory cells which are associated with one of the word lines may be further associated with less than six of the rails.

In various aspects of the foregoing embodiments, numerous options may be employed. For example, a process may be provided for manufacturing an integrated circuit with the various features mentioned hereinabove. Still yet, a computer program product embodiment may be situated on a computer readable medium for encoding an integrated circuit that is configured in the manner described above.

BRIEF DESCRIPTION OF THE DRAWINGS

FIG. 14 illustrates a method for manufacturing an integrated circuit, in accordance with another embodiment.

DETAILED DESCRIPTION

Figure 1:
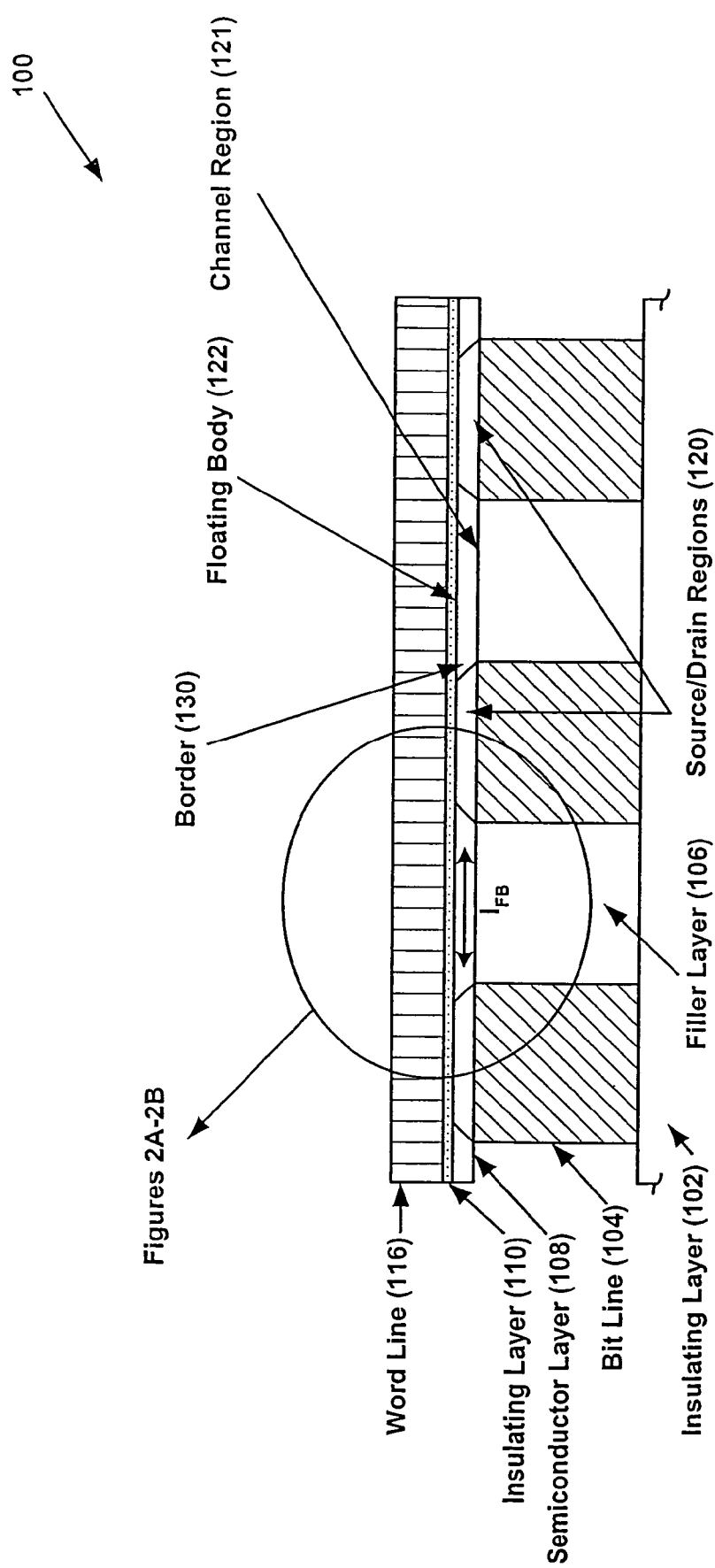
FIG. 1 is a cross-sectional view showing a portion of an array of memory cells, according to one embodiment.

FIG. 1 is a cross-sectional view showing a portion of an array of memory cells 100, according to one embodiment. While only a portion of such array of memory cells 100 is shown, it should be understood that a multiplicity of memory cells 100 may span in two directions. Further, while only one level of memory cells 100 is described, it should further be noted that, in some optional embodiments, a plurality of levels of the memory cells 100 may be vertically disposed to form a three-dimensional array of memory cells 100. Of course, the various features set forth herein are further contemplated for a two-dimensional array of memory cells 100.

As shown, the array of memory cells 100 may be formed over a planarized surface of an insulating layer 102. While the planarized insulating layer 102 may take any desired form, it may, in one possible embodiment, take the form of a chemical-mechanical polished (CMP) planarized silicon oxide layer. Of course, any desired planarization technique may be employed such as a dielectric etch-back operation (where oxide over a surface is subjected to reactive ion etching), and/or any other planarization technique.

Insulating layer 102 may further be formed above a substrate (not shown), as in the aforementioned three-dimensional array embodiment. While the array of memory cells 100 are shown to be formed over a planarized insulating layer 102, it should be noted that such array of memory cells 100 may also be formed in the abovementioned unillustrated substrate.

Positioned above the insulating layer 102 is a plurality of bit lines 104 which, at least in part, extend along a first direction. Disposed between the bit lines 104 is an insulating filler layer 106, such as silicon oxide or any other desired material. The bit lines 104 may be manufactured utilizing any desired material such as polysilicon (e.g. heavily doped polysilicon). Optionally, a metal or metal silicide layer may be formed in contact with the bit lines 104 to increase conductivity. Of course, the bit lines 104 may include metal or metal silicide instead of polysilicon, if desired.

A semiconductor layer 108 is situated over the bit lines 104 and filler layer 106, as shown. While, in one embodiment, the semiconductor layer 108 may include silicon, it should be noted that any other types of semiconductor material (e.g. $Si_xGe_y$ alloy, Ge semiconductor) may also be used, as desired. The type of such semiconductor layer 108 (e.g. p-type, n-type) may further vary based on the desired configuration thereof. For example, in a three-dimensional embodiment with multiple, vertically disposed arrays of memory cells 100, arrays of both p-type and n-type semiconductor layers 108 may co-exist in the integrated circuit at different levels above and beneath each other.

In one embodiment where the semiconductor layer 108 includes a p-type semiconductor, the semiconductor layer 108 may be used to form NMOS transistors.

Specifically, N+ diffusion regions, operating as source and drain regions 120, may be disposed in the semiconductor layer 108. Further, portions of the semiconductor layer 108 between the source and drain regions 120 may comprise NMOS channel regions 121. As an option, the aforementioned NMOS transistors may take the form of thin film transistors (TFTs) to optionally afford devices with a source and a drain each formed as a rail.

In another embodiment, the semiconductor layer 108 may include an n-type semiconductor. To this end, the semiconductor layer 108 may be used to construct PMOS transistors, where P+ diffusion regions, operating as source and drain regions 120, are disposed in the semiconductor layer 108. Further, portions of the semiconductor layer 108 between the source and drain regions 120 may comprise PMOS channel regions 121. Of course, as previously suggested, p-type and n-type dopings may be reversed, as desired. By this design, as shown in FIG. 1, the bit lines 104 are situated below the channel region 121 of corresponding memory cells 100.

In one exemplary manner of construction, the source and drain regions 120 may be formed by outdiffusion of dopants from the bit lines 104. However, it should be noted that the source and drain regions 120 may be formed by any other desired method, such as by updiffusion, masking and ion implantation, etc. In use, the bit lines 104 contact the source and drain regions 120. Thus, in the context of the present description, a bit line 104 refers to any member (e.g. rail) that is, at least in part, separate from the source and drain regions 120 and used for communicating therewith.

Positioned over the semiconductor layer 108 is an insulating layer 110. In one embodiment, where MOSFET devices are desired, the insulating layer 110 may take the form of a thin silicon dioxide layer or any other suitable dielectric.

Still yet, in yet another embodiment where a floating body-type cell is desired, a floating body 122 may be formed in each channel region 121 as part of the semiconductor layer 108. In the context of the present description, the floating body 122 refers to any body in the channel region 121, which stores a charge for indicating a memory cell state (e.g. on, off). While the floating body 122 may be constructed utilizing any desired material, in one embodiment, at least a portion of the floating body 122 may include a recrystallized semiconductor material. In a further embodiment, such floating body 122 may be employed to provide volatile memory cells 100. Of course, it should be noted that any type of technology may be employed which is capable of constructing memory cells 100 that are volatile.

During use, in an embodiment where volatile memory cells 100 are employed, such volatile memory cells 100 may substantially retain a memory state-indicating charge during a read operation. In an embodiment where the floating body 122 is used, such charge may be retained in the volatile memory cells 100 by storing the charge in the floating body 122 that resides in a channel region of the volatile memory cells 100. By this structure, a "non-destructive" or "quasi-non-destructive" read operation may be performed during which substantially no charge is lost, since the charge is stored in the floating body 122 as opposed to a capacitor associated with the memory cell 100 (which would typically contribute to charge-loss).

While this charge storage may be accomplished in any desired manner, one embodiment may utilize a high voltage difference between the bit lines 104 (i.e. between a bit line and a common bit line) which, in turn, ensures a high field at a junction between one of the bit lines 104 and an associated drain region 120. Such high field further enables use of impact ionization during operation, as will be set forth in greater detail later.

As yet a further option, a writeable (e.g. re-writeable) floating body 122 may be provided. Of course, any desired insulating layer 110 and overlying layers, if any, may be employed, as desired, for affording different types of memory cells.

In one embodiment, the source and drain regions 120 may be self-aligned to a corresponding bit line 104. Note FIG. 1. Specifically, as mentioned previously, the memory cells 100 may each include at least one diffusion region (e.g. source and drain region 120) and at least one channel region 121. Thus, in the present embodiment, borders 130 between the at least one diffusion region and the at least one channel region 121 may be self-aligned to a corresponding bit line 104. It should be noted that, in the context of the present description, "self-aligned" refers to any alignment that is not substantially determined by a lithography alignment step. For example, such self alignment can be produced by out-diffusion or crosswise juxtaposition of patterned shapes. Alternative techniques including self-assembly processes, etching in the same patterning step, damascene processes and sidewall deposition processes are also envisioned.

During operation, the bit lines 104 may serve as common lines, in a manner that will be set forth later in greater detail. The bit lines 104 may extend in a first direction parallel to (and optionally coplanar with) a second direction in which the corresponding common lines extend, according to one embodiment. In the present description, the term "parallel" may further include situations where the lines are slightly skewed due to intentional or unintentional design/manufacturing-related modifications.

With continuing reference to FIG. 1, positioned above the insulating layer 110 is a plurality of word lines 116. In the context of the present description, a word line 116 refers to any member (e.g. rail) that is, at least in part, separate from the channel region 121 and used for communicating therewith.

While any desired number of levels of word lines 116 and bit lines 104 may be employed, a three-dimensional embodiment of memory cells 100 includes more than one level of word lines 116 and/or more than one level of bit lines 104, where the word lines 116 and the bit lines 104 are disposed perpendicular with respect to each other in successive planes. Further in the context of the present description, a "level" of the three-dimensional array embodiment includes a plurality of word lines 116, a plurality of bits line 104, and/or a plurality of memory cells 100 substantially positioned in a common approximate plane, although word lines 116 and bit lines 104 can be shared between levels in some embodiments.

While not shown, in one illustrative embodiment, each word line 116 may include a first N+ polysilicon layer, a silicide layer (e.g. a $TiSi_x$ or $WSi_x$ layer) over the first N+ polysilicon layer, and a second P+ polysilicon layer above the silicide layer. Of course, the layering order and materials of the above layers may vary, as desired. To this end, the word line 116 may act as a gate electrode in each associated transistor. Thus, in one embodiment, no separate gate electrodes are necessarily connected to the word lines 116.

In one embodiment, at least one of the bit lines 104 corresponding to the floating body memory cell 100 may be situated at a first side with respect to the floating body 122, while at least one of the word lines 116 corresponding to the floating body 122 may be situated at a second side, opposite the first side. Note FIG. 1. It should be noted that the term "side," in the present description, is not restricted to any type of lateral connotation, but rather refers to any area separated from another area by an intervening feature (e.g. the floating body 122).

As will soon become apparent in greater detail, by virtue of the foregoing structure, a current $I_{FB}$ flows through the semiconductor layer 108 and the associated floating body 122, in a second direction that is different from (e.g. perpendicular) the first direction in which the bit lines 104 extend. As yet another option, the word lines 116 may be disposed in a third direction, where the second direction is parallel with the third direction.

It should be noted that the foregoing structure of FIG. 1 may be manufactured using any desired manufacturing process. Just by way of example, the array of memory cells 100 may be constructed utilizing the process set forth in FIGS. 88A-88D (and the relevant descriptions) in U.S. Patent App. Publication No.: 2002/0028541, filed Aug. 13, 2001, which is incorporated herein by reference in its entirety for all purposes. Of course, any other techniques and/or features (e.g. those described in FIGS. 66-74, 87, 89, 92) may further be optionally incorporated, as desired.

More illustrative information will now be set forth regarding various optional architectures and/or functional features with which the foregoing structure may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
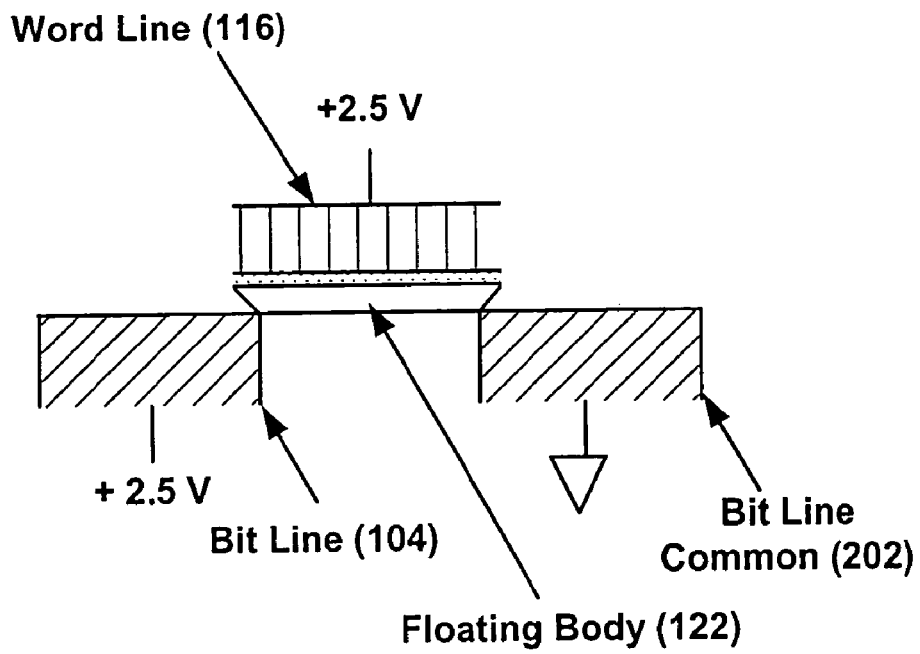
FIGS. 2A and 2B illustrate one of the memory cells encircled in FIG. 1 in use during a write and read operation, respectively.
Figure 2B:
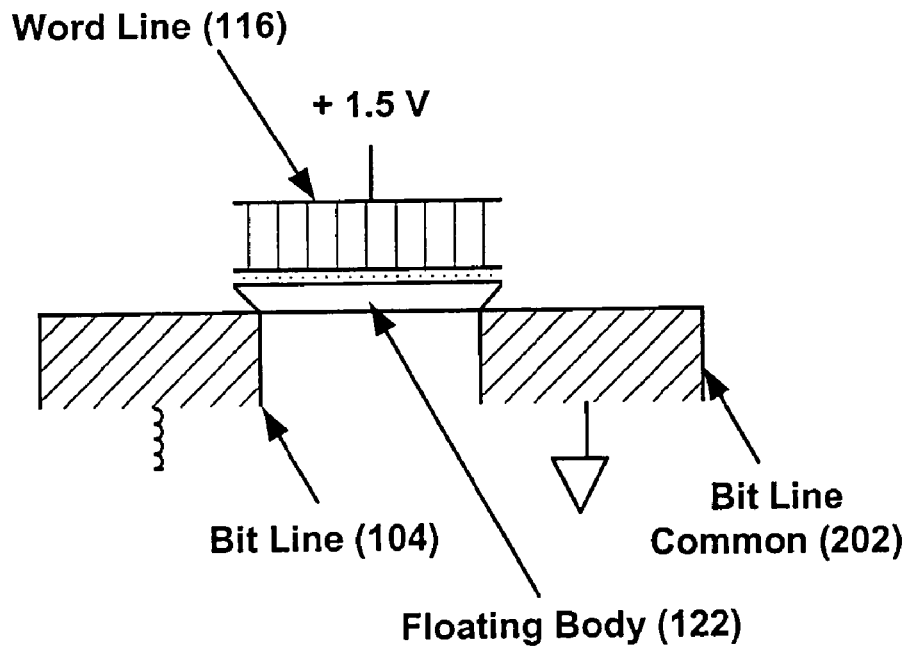

FIGS. 2A and 2B illustrate one of the memory cells encircled in FIG. 1 in use during a write and read operation, respectively. In use, one of the bit lines 104 operates as a common bit line 202, while the word line 116 operates as a gate over the floating body 122. More information regarding the designation of the common bit line 202 will be set forth later in greater detail.

As shown in FIG. 2A, a write 1 operation may be carried out on a first memory cell by applying +2.5V to the word line 116 and the associated selected, or accessed, bit line (BLS) 104, while the common bit line 202 is maintained at GND. Note Table 1 below:

TABLE 1

Write 1
WL: +2.5 V
BLS: +2.5 V
BL Common: GND

An unillustrated write 0 operation may be carried out by applying +2.5V to the word line 116, and applying −1.0V to the associated selected bit line (BLS) 104, while the common bit line 202 is maintained at GND. Note Table 2 below:

TABLE 2

Write 0
WL: +2.5 V
BLS: −1.0 V
BL Common: GND

As shown in FIG. 2B, a read operation may be carried out by applying between ~+0.5-1.0V to the selected bit line (BLS) 104, and +1.5V to the word line 116, while the common bit line 202 is maintained at GND. Note Table 3 below:

TABLE 3

Read
WL: +1.5 V
BLS: ~+.5-1 V
BL Common: GND

As mentioned previously, the read operation may be quasi-non-destructive, in use. In other words, current passing through the memory cell 100 may be sensed without necessarily removing a positive charge stored on the floating body 122. In each word line cycle from device-on to device-off, however, a few positive charges may be lost due to a known "charge pumping" effect. Further, the discharged floating body 122 may slowly change due to junction leakage currents. To this end, the data in the memory cell 100 may need to be periodically refreshed.

Figure 3:
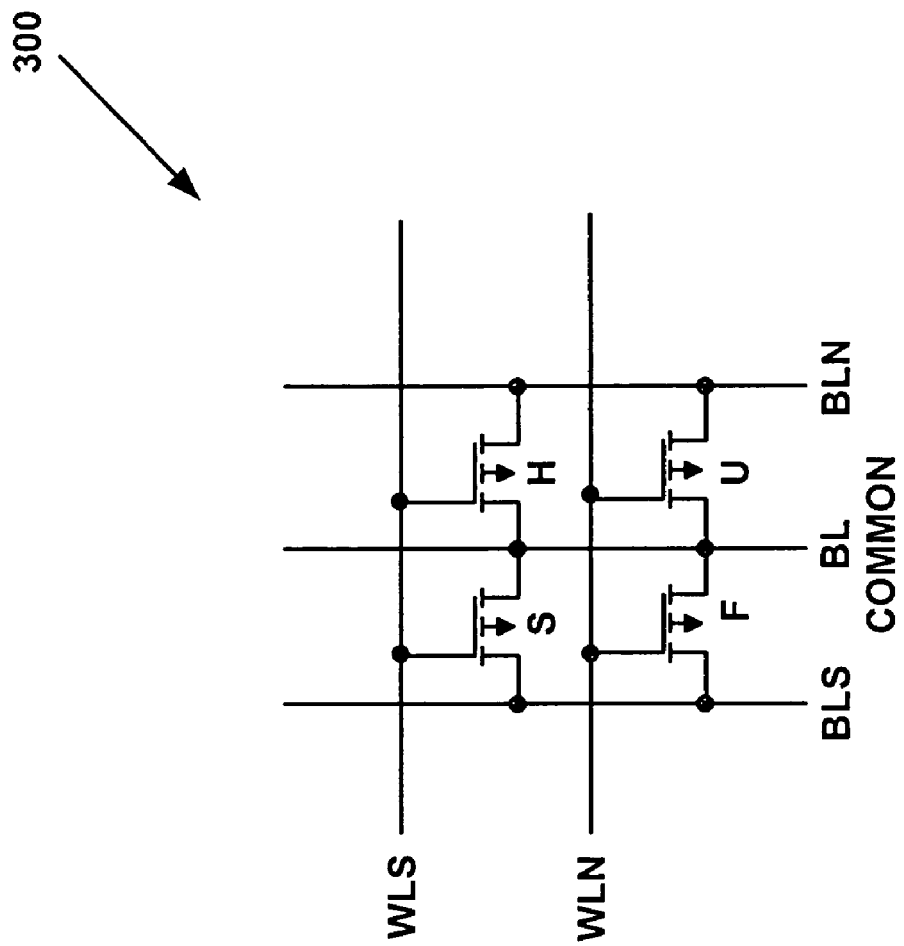
FIG. 3 illustrates an electrical schematic diagram of a memory array, which may be constructed utilizing the memory cells of FIG. 1, in accordance with one embodiment.

FIG. 3 illustrates an electrical schematic diagram of a memory array 300, which may be constructed utilizing the memory cells of FIG. 1, in accordance with one embodiment. The memory array 300 includes a plurality of memory cells S, H, F, U, which are interconnected by a plurality of word lines WLS (word line selected), WLN (word line not-selected) and bit lines BLS (bit line selected), BLCommon (bit line common), BLN (bit line not-selected), in the manner shown.

Table 4 is a bias table which illustrates, row-by-row, operation of the transistors of each memory cell and associated lines, during a write operation (see FIG. 2A, for example), and a read operation (see FIG. 2B, for example). In each column, such table sets forth the state of each of the memory cells S, H, F, U, as well as the voltage (or lack thereof) at each of the lines WLS, WLN, BLS, BLCommon, BLN. The H cells (i.e. those that are connected to the selected word line but are not selected for writing) hold data because both the associated bit line 104 and common bit line 202 are at GND such that no current flows through the H cells and no H cell floating bodies are forward biased to bit lines. The U cells and F cells, which are connected to unselected word lines, hold associated previous memory states because the unselected word lines are driven to −2.5 V. The floating bodies of U and F memory cells are coupled to a negative voltage and are not disturbed by the bit line voltages.

a small band gap with respect to silicon channels and may greatly enhance the rate at which the floating body 122 is charged for higher performance write operations. Of course, absolutely any desired type of semiconductor materials may be employed, as desired.

Still yet additional illustrative information will now be set forth regarding various optional architectures and/or functional features of optional embodiments with which the foregoing structure may or may not be implemented, per the desires of the user. It should be strongly noted that the following information is set forth for illustrative purposes and

TABLE 4

Bias Table

| Array Line/Cell | Cell: S | Line: WLS | Cell: H | Line: BLCom BLN | Cell: U | Line: WLN | Cell: F | Line: BLS |
|---|---|---|---|---|---|---|---|---|
| Write 1 (Low $V_T$ Pos. Charge on FB) | Saturated | +2.5 V | No Current Flow | GND | Device Off | −2.5 V | Floating Body is Low to Hold Data | +2.5 V |
| Write 0 (High $V_T$ Discharge the FB) | Forward Bias Floating Body to BLS | +2.5 V | Floating Body Couples up, but does not Forward Bias to BLC/BLN | GND | Device Off | −2.5 V | Floating Body is Low to Hold Data | −1 V |
| Read | Current Flow Depending on $V_T$ | 1.0 V | No Current Flow | GND | Device Off | GND | Device Off | ~.05–1 V |

It should be noted that the voltages set forth in Table 4 are illustrative in nature and should not be construed as limiting in any manner. Such voltages may differ in magnitude and polarity in other embodiments depending on device specifics (e.g. moved threshold voltage, capacitive coupling between word line and channel). Further, in a two-pass write embodiment, the write 1/WLS voltage (i.e. the voltage on the selected word line during a write 1 operation) may differ from the write 0/WLS voltage. Also the WLN voltage may be more negative or more positive than the value shown in Table 4. Also, the unselected bit line and common bit line voltages may be a positive voltage. More information regarding such embodiment is set forth in greater detail hereinafter as well as in a co-pending application Ser. No. 11/157,317 filed coincidentally herewith, naming common inventorship, and entitled "VOLATILE MEMORY CELL TWO-PASS WRITING METHOD," which is incorporated herein by reference in its entirety for all purposes.

In one embodiment, the write mechanism for charging the floating body 122 may include impact ionization when the cell is in saturation. This mechanism may be slower in TFT devices with respect to single crystal silicon devices, because of a lower mobility of TFT material. In use, the gate of the cell may be held positive and the drain may be greater than the gate voltage, minus a threshold voltage. Further, the write mechanism for discharging the floating body 122 raises the word line 116 to a high voltage, which capacitively couples up the floating body 122 and reduces the voltage at BLS to ground or a negative voltage, in order to forward bias the device junction and discharge the floating body 122.

In some embodiments, a $Si_xGe_y$ alloy and/or Ge semiconductor channel region 121 may be used. These materials have should not be construed as limiting in any manner. Again, any of the following features may be optionally incorporated with or without the exclusion of other features described.

"$4F^2$" Cell Embodiment

Figure 4:
FIG. 4 illustrates an array of memory cells, which are each formed among a plurality of bit lines and word lines.
Figure 4:
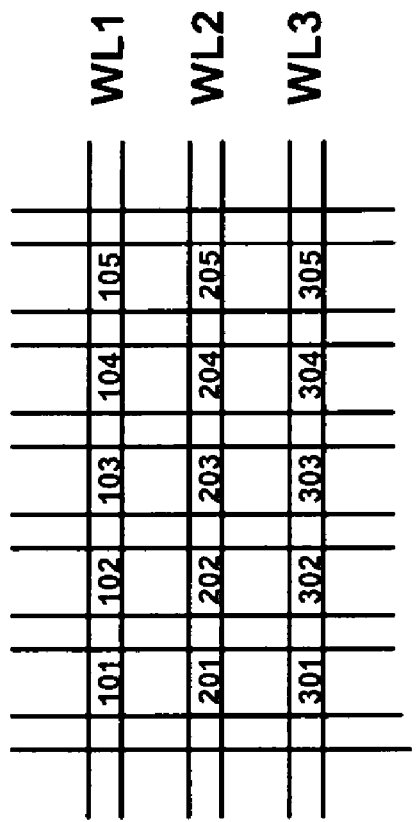

FIG. 4 illustrates an array of memory cells 400, which are each formed at the intersections of respective bit lines BL1, BL2, BL3, BL4, BL5, BL6, and word lines WL1, WL2, WL3. Specifically, the memory cells 400 are positioned at the various indicated locations (i.e. on both sides of the bit lines at each intersection with the word lines), providing a "$4F^2$" cell that is four (4) times the feature size (F), squared. While different embodiments will be described later, a shared bit line array embodiment will first be set forth.

In use, the role of the bit lines BL1, BL2, etc. as a common line or not is determined as a function of which memory cell(s) is selected via the associated word lines WL1, WL2, etc. For example, if memory cells 101 and 102 are selected by selecting word line WL1 and bit lines BL1 and BL3, bit lines BL1 and BL3 may serve as selected bit lines, while bit line BL2 may serve as a bit line common (note FIG. 3). Of course, a write 1 mechanism may also be selective to one cell of each pair which shares a bit line, since it requires the cell to be conducting in saturation.

Figure 5A:
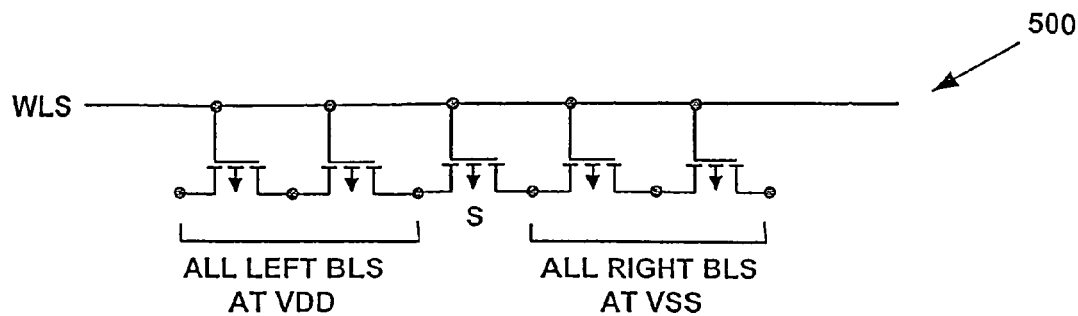
FIG. 5A illustrates an electrical schematic diagram illustrating a memory array which may be constructed in accordance with one embodiment.

FIG. 5A illustrates an electrical schematic diagram illustrating a memory array 500 which may be constructed in accordance with the present embodiment. As shown, a selected cell S may be flanked to the left by bit lines at $V_{DD}$ and to the right by bit lines at $V_{SS}$.

During both write and read operations, a single cell on a bit line may be active. However, on the other hand, several cells may be active by alternating groups of high bit lines and low bit lines. In the context of a write mechanism using impact ionization or field induced leakage, such write mechanism depends on the presence of some drain-to-source voltage. Thus, an adjacent cell is likely subjected to very low leakage generation.

In an optional embodiment where volatile memory cells include thin-film transistor (TFT) devices each with a source and a drain formed as a rail, three adjacent memory cells which are associated with one of the word lines may be further associated with less than five of the rails, in the manner shown in FIG. 5A. Further, in another exemplary aspect of the present embodiment, four adjacent memory cells which are associated with one of the word lines may be further associated with less than six of the rails.

In some embodiments of the foregoing $4F^2$ layout, a write off operation (i.e. write 0) may not necessarily be selective to a single bit associated with a cell. Instead, a pair of bits may be written off when an associated word line is high and a bit line is low. In such embodiment, the bit pairs may reside within the same user word delivered to the memory for writing. Such words are typically 1 to 4 bytes in length. As an option, all bits may be written off in a word, whereafter selected bits are written on, so that no data is lost during use.

While a shared bit line embodiment has been set forth, various $4F^2$ cell implementation features will now be set forth which may differ from such embodiment. For example, in one embodiment, multiple cells that share a bit line and a word line may be written off at the same time. Thereafter, a selective write on operation (i.e. write 1) may be performed. In such embodiment, a write off operation may be referred to as an erase operation, since a group of cells may be written off at the same time. Of course, a user does not necessarily have to be aware of such feature. In use, a write on operation may be performed first as a group of cells, so that a $4F^2$ cell may be used for general re-writable memory operations.

Figure 5B:
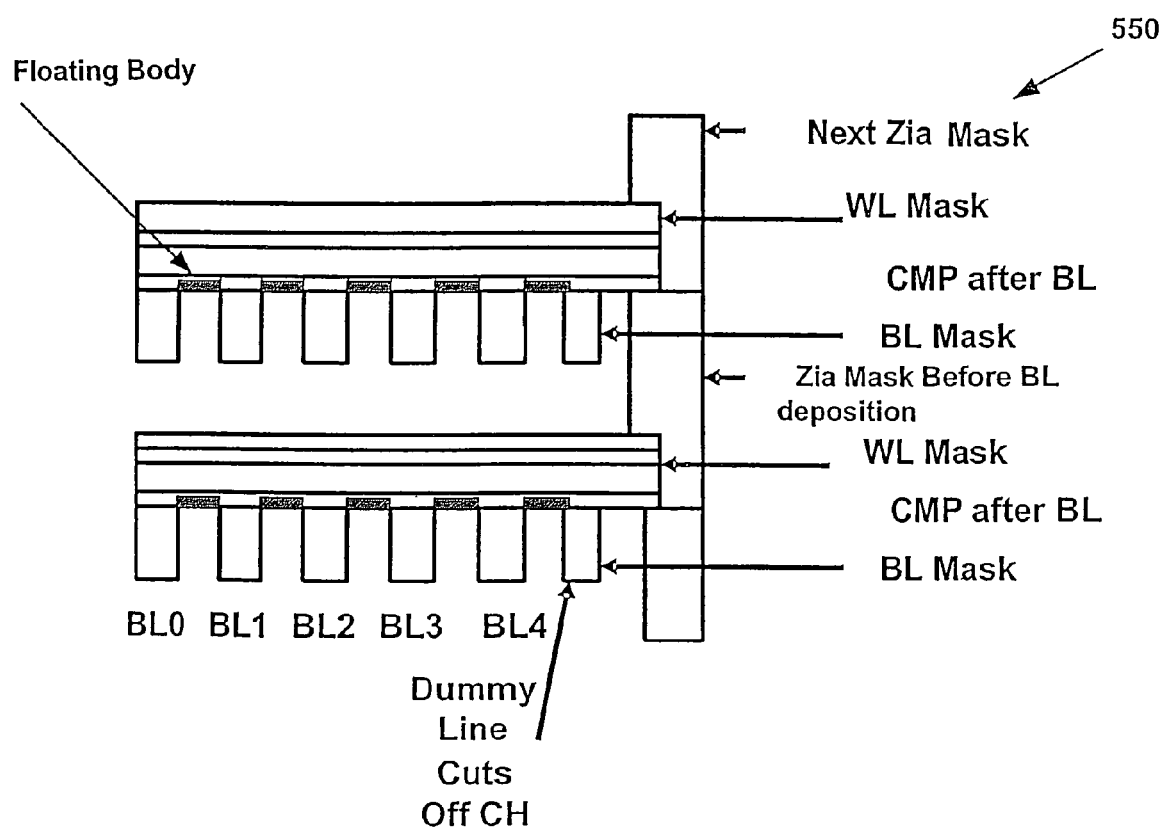
FIG. 5B illustrates a stacked, non-mirrored memory array structure, in accordance with another embodiment.

FIG. 5B illustrates a stacked, non-mirrored memory array structure 550, in accordance with another embodiment. Shown in such figure is a particular timing of the etching of a related vertical connection, termed a "zia," in the context of the present $4F^2$ layout. Such zia relates to a via-type structure connecting more than one level in the z-direction. In the present figure, a zia hole may be etched before the deposit of the bit line material, such that such bit line material may be used to fill the zia hole, in the manner shown.

As depicted, a dummy bit line at an end of a word line may optionally be used to electrically cut off the channel region, which may be self-aligned to the word line and may short to the word line voltage at the zia. As a further option, bit line contacts may be positioned every 64 to 512 cells, and zias may be interleaved, in some embodiments, thus obviating the need for positioning the zia on the same pitch as the memory cell.

"$6F^2$" Cell Embodiment

Figure 6:
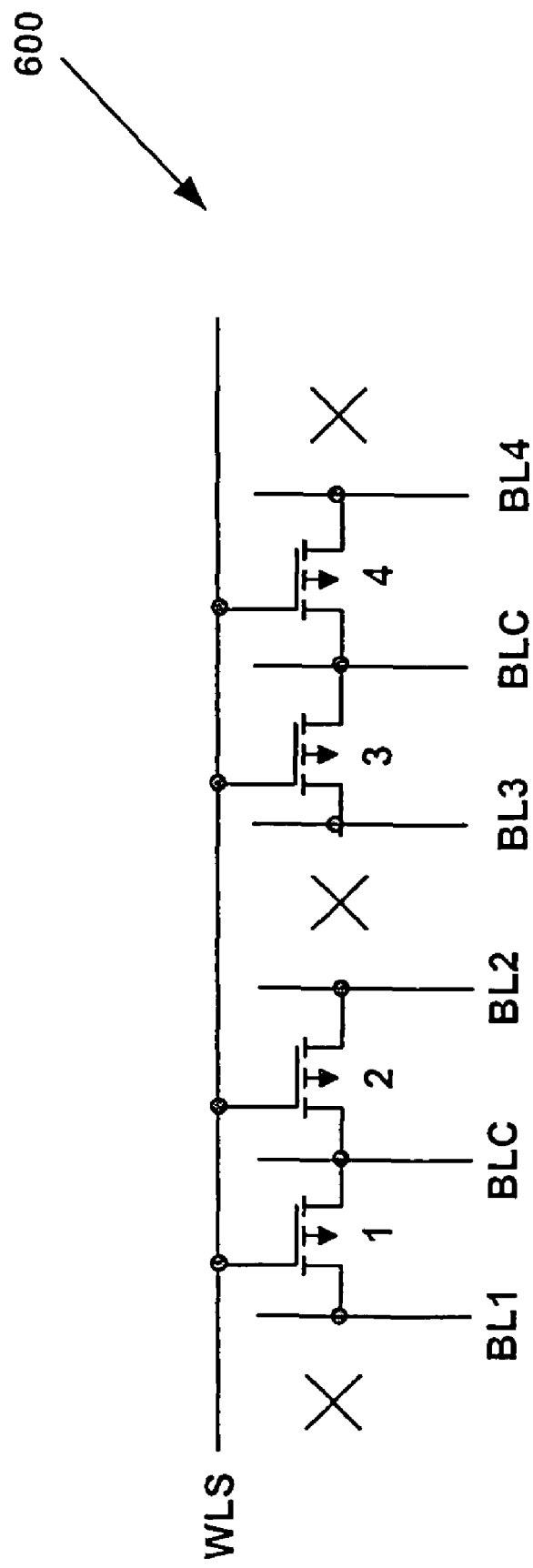
FIG. 6 illustrates an electrical schematic diagram of an array of memory cells which may be constructed in accordance with another embodiment.

In the present embodiment, channel regions are removed from some potential memory cells before the corresponding word line is formed, so that only a portion (e.g. half) of the cells along the bit line are formed. FIG. 6 illustrates an electrical schematic diagram of an array of memory cells 600 which may be constructed in accordance with the present embodiment. As shown, no cell exists between bit line BL2 and bit line BL3, for improved write selectivity. Optionally, a channel trim operation may be used to remove the channel region from locations where no memory cells are desired.

It should be noted that in other embodiments, for some choices of voltages and device properties, a high field at a gate-to-bit line overlap region may produce a leakage from the bit line-to-floating body. In the present embodiment, however, when writing a charged floating body state (i.e. low $V_t$), a gate-to-bit line overlap region at location X is avoided. Thus, the cell at the leftmost location X, for example, may be partially written to a low $V_t$ state while only cell #1 was intended to be written. The cells that are on either side of a common bit line are not disturbed. While reading, there are no cells that share a word line and a bit line, so any possible read leakage path is further removed.

While $4F^2$ and $6F^2$ embodiments have been disclosed herein, various embodiments are contemplated where each memory cell covers an area less than $8F^2$, and F is a feature size of each memory cell. Still yet, additional embodiments may be provided where each memory cell covers an area less than $6F^2$, and F is, again, the feature size of each memory cell.

Updiffusion Cell Embodiment

In an updiffusion cell embodiment, source and drain regions may be self-aligned to an edge of the bit lines by updiffusion of n-type dopants from the bit line into a low doped p-type channel. Further, a thin oxide gate may be grown or deposited on the channel region before the word line is deposited.

Various Three-Dimensional Embodiments

Figure 7:
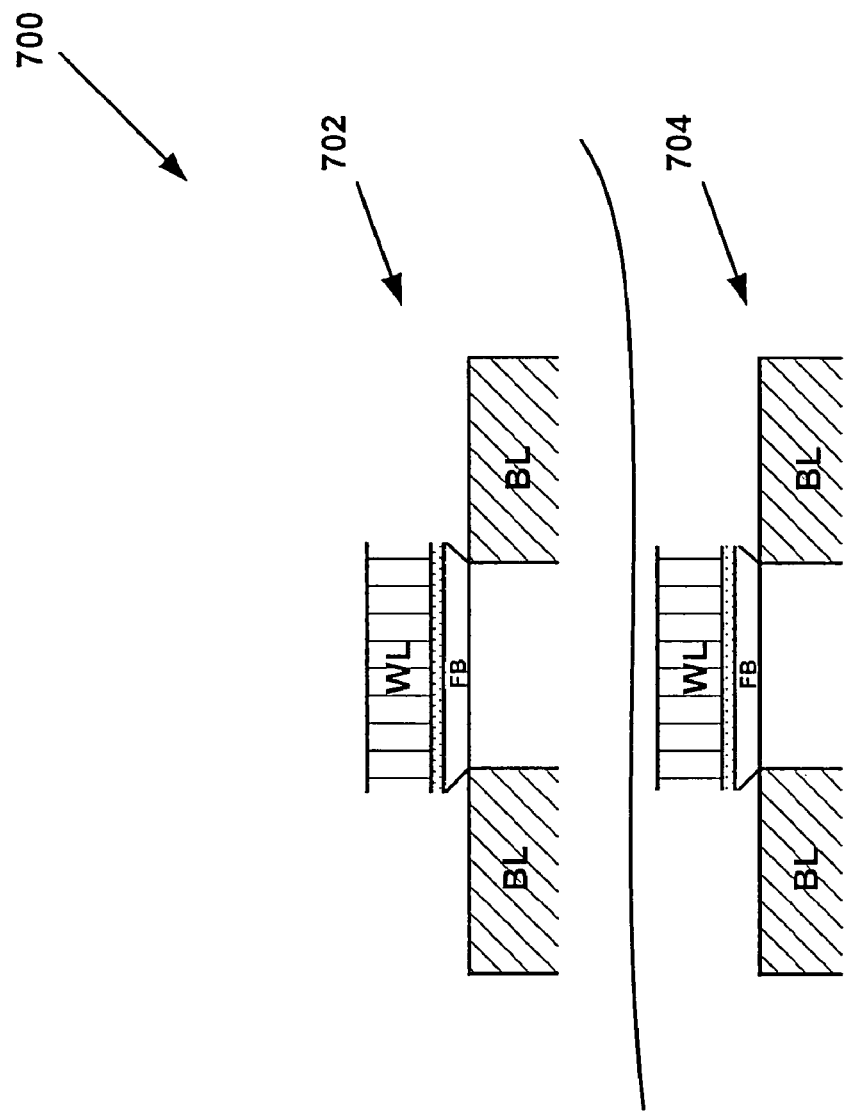
FIG. 7 illustrates one three-dimensional memory array arrangement where multiple levels of memory cells do not share lines, in accordance with one embodiment.

FIG. 7 illustrates one three-dimensional memory array arrangement 700 where multiple levels of memory cells do not share lines, in accordance with one embodiment. Specifically, as shown, the bit lines of an upper level 702 are not in communication with the word lines of a lower level 704, and visa-versa. Thus, at least one level of the word lines may be used exclusively by a single level of the three-dimensional array of memory cells. Further, at least one level of the bit lines may be used exclusively by a single level of the three-dimensional array of memory cells. To this end, additional lines are required.

Figure 8A:
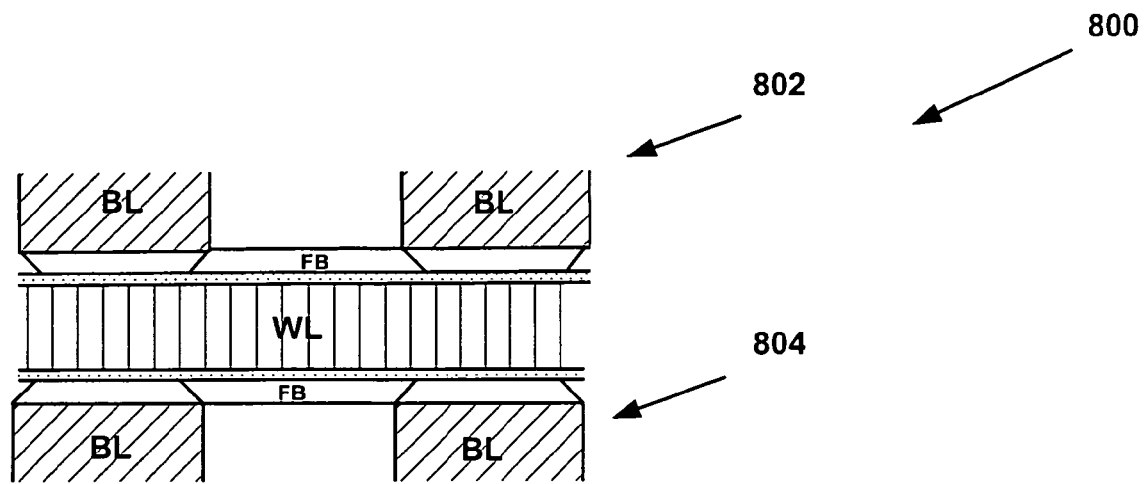
FIG. 8A illustrates another three-dimensional memory array arrangement where multiple levels of memory cells share word lines, in accordance with another embodiment.

FIG. 8A illustrates another three-dimensional memory array arrangement 800 where multiple levels of memory cells share word lines, in accordance with another embodiment. As shown, respective word lines are shared by a plurality of levels of the three-dimensional array of memory cells. Specifically, in one embodiment, the bit lines of an upper level 802 and a lower level 804 are both in communication with the same word lines. To this end, fewer lines are required.

Figure 8B:
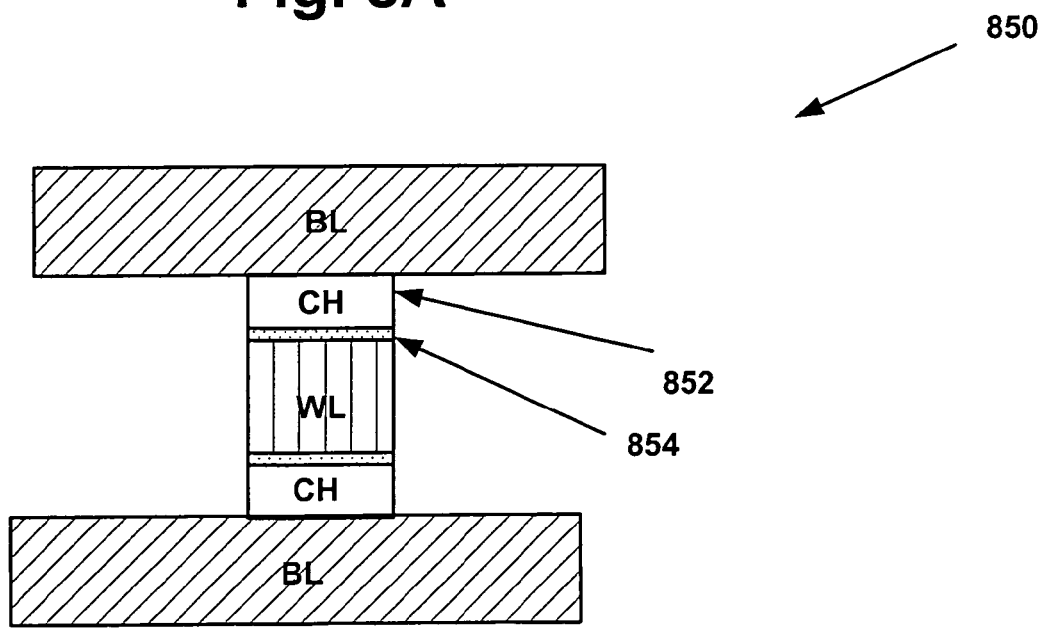
FIG. 8B illustrates yet another three-dimensional memory array arrangement where multiple levels of memory cells share word lines, in accordance with another embodiment.

FIG. 8B illustrates yet another three-dimensional memory array arrangement 850 where multiple levels of memory cells share word lines, in accordance with another embodiment. Similar to the previous embodiment of FIG. 8A, the bit lines of an upper level and a lower level are both in communication with the same word lines. Still yet, in the present embodiment, a channel 852 is self-aligned to sides of the word line. This may, in one embodiment, be accomplished by etching the channel 852 and word line, as a stack. Further note should be made to the presence of a thin oxide 854 residing between the channel 852 and word line.

Figure 9:
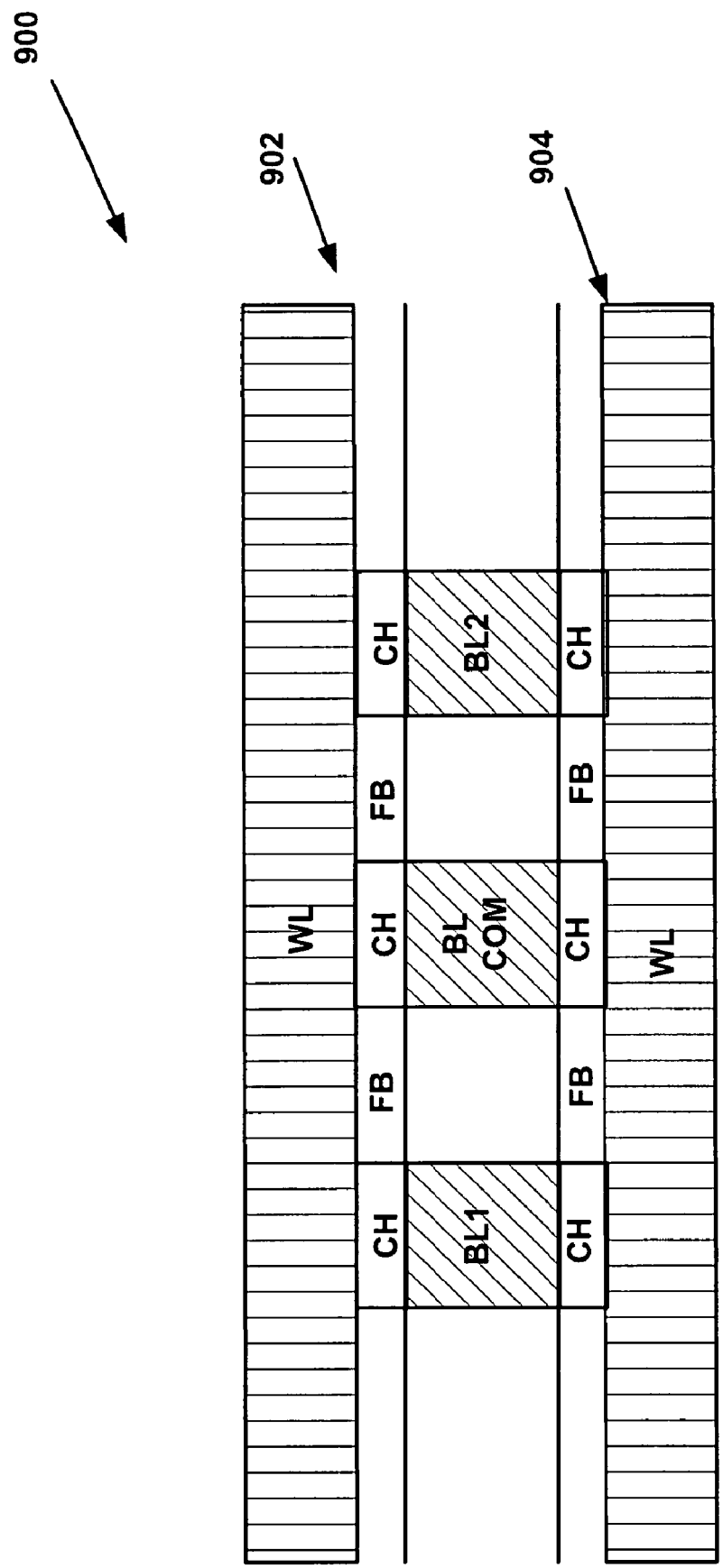
FIG. 9 illustrates another three-dimensional memory array arrangement where multiple levels of memory cells share bit lines, in accordance with still yet another embodiment.

FIG. 9 illustrates another three-dimensional memory array arrangement 900 where multiple levels of memory cells share bit lines, in accordance with still yet another embodiment. As shown, the word lines of an upper level 902 and a lower level 904 are both in communication with the same bit lines. Specifically, in one embodiment, respective bit lines are shared by a plurality of levels of the three-dimensional array of memory cells. While not specifically diagrammed, it should be understood that, in yet another embodiment, both respective bit lines and word lines may be shared by a plurality of levels of the three-dimensional array of memory cells, in accordance with the teachings of FIGS. 8A, 8B, and 9.

Polysilicon Field Conductor Embodiments

Figure 10:
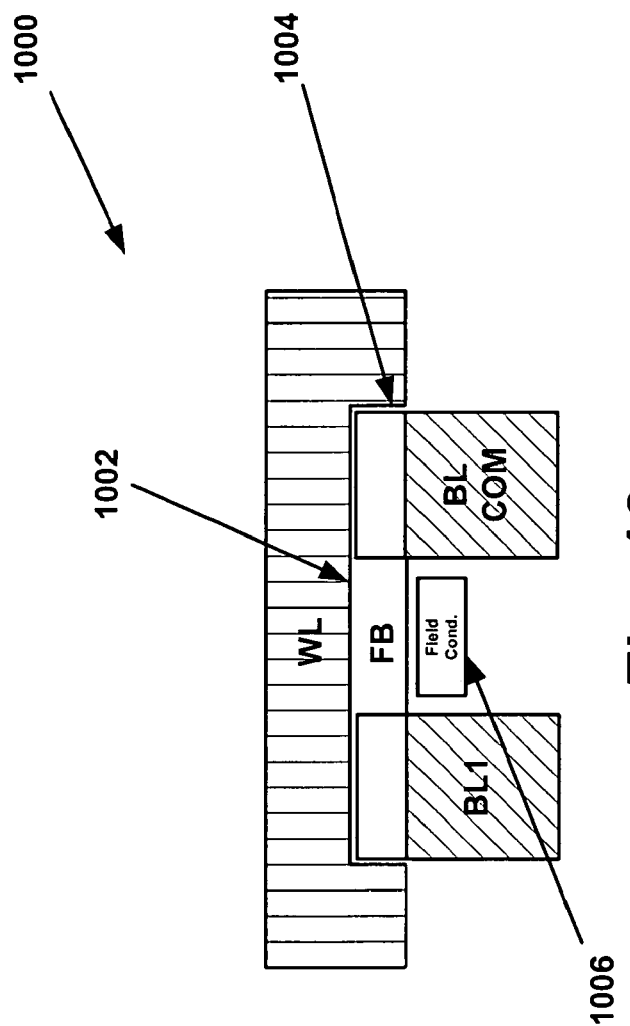
FIG. 10 illustrates a memory cell arrangement including a polysilicon field conductor, in accordance with another embodiment.

FIG. 10 illustrates a memory cell arrangement 1000 including a polysilicon field conductor 1006, in accordance with another embodiment. As shown in FIG. 10, a word line WL is positioned above a plurality of bit lines BL1, BLCOM, and extends beyond a trim mask edge 1004 formed by etching the channel layer, and is further buffered from the channel layer via a thin oxide gate 1002.

The polysilicon field conductor 1006 (of doped polysilicon) is positioned between the bit line BL1 and common bit line BLCOM. In use, the polysilicon field conductor 1006 increases a capacitance at a bottom of a floating body FB which, in turn, increases an amount of charge stored.

Figure 11:
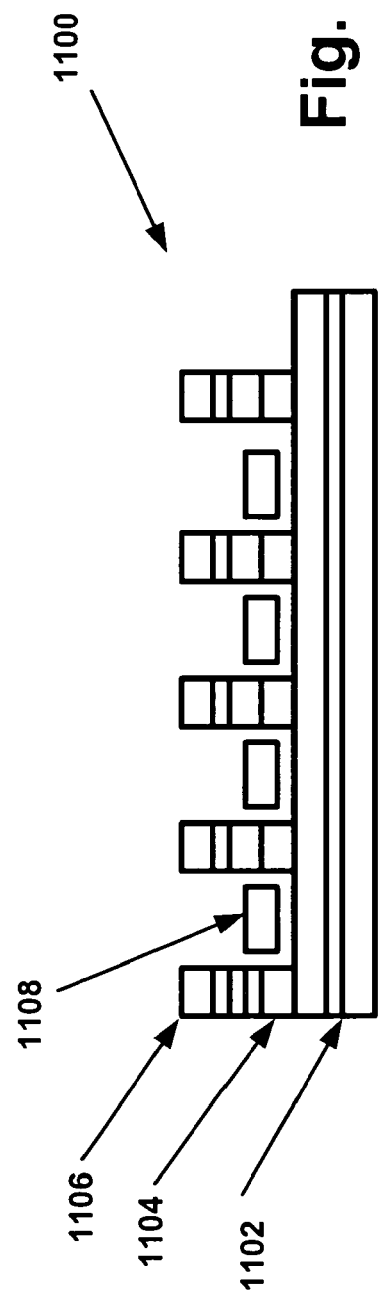
FIG. 11 illustrates another memory cell arrangement including polysilicon field conductors, in accordance with yet another embodiment.

FIG. 11 illustrates another memory cells arrangement 1100 including polysilicon field conductors 1108, in accordance with yet another embodiment. As shown in FIG. 11, a plurality of word lines 1106 is positioned above a bit line 1102 with floating bodies 1104 therebetween. The polysilicon field conductors 1108 (of doped polysilicon) are positioned between each of the word lines 1106. In use, each polysilicon field conductor 1108 increases a capacitance at the bottom of the corresponding floating body 1104 which, in turn, increases an amount of charge stored.

By this structure, sidewall passivation is thus provided, with a good etch rate-to-polysilicon ratio. During manufacture, doped polysilicon may be deposited in grooves defined by the word lines 1106, and a trim mask may be used to define ends of the polysilicon field conductors 1108.

In use, the polysilicon field conductors 1108 may be driven to a high or low voltage at various operations to enhance coupling voltage charges on the floating body 1104, so the discharged floating body is at a lower voltage than otherwise possible, and a $V_{t\ difference}$ is increased. The polysilicon field conductors 1108 may also partially affect an adjacent row of memory cells. While this is not ideal, any such disadvantage may be offset by a smaller cell size resulting from the present construction.

Still yet additional embodiments may be provided in the context of the structure of FIG. 11. For example, in one embodiment, a polysilicon field conductor may be provided for each row of memory cells connected to a particular word line. In such embodiment, these polysilicon field conductors only affect a single row of cells, and do not necessarily couple to the adjacent row of memory cells (which is not necessarily written at the same time). A sidewall definition or other self-alignment process may be used to form the doped polysilicon field conductor adjacent and self-aligned to a word line associated with a row of floating body memory cells. Optionally, the side wall definition process provides an array structure with two polysilicon field conductor lines between adjacent rows separated by a gap, such that the doped polysilicon field conductor capacitively couples predominantly to a single row of cells. This feature may be used to avoid non-ideal capacitive coupling of the polysilicon field conductor to an adjacent row of cells. Optionally, a slight gap may be provided by lithography patterning of the cell structure to form two polysilicon field conductor lines between adjacent rows.

In yet another embodiment, a group of rows may share polysilicon field conductor nodes, which are driven together. In the present embodiment, the group of rows may be written off in a common operation.

Figure 12:
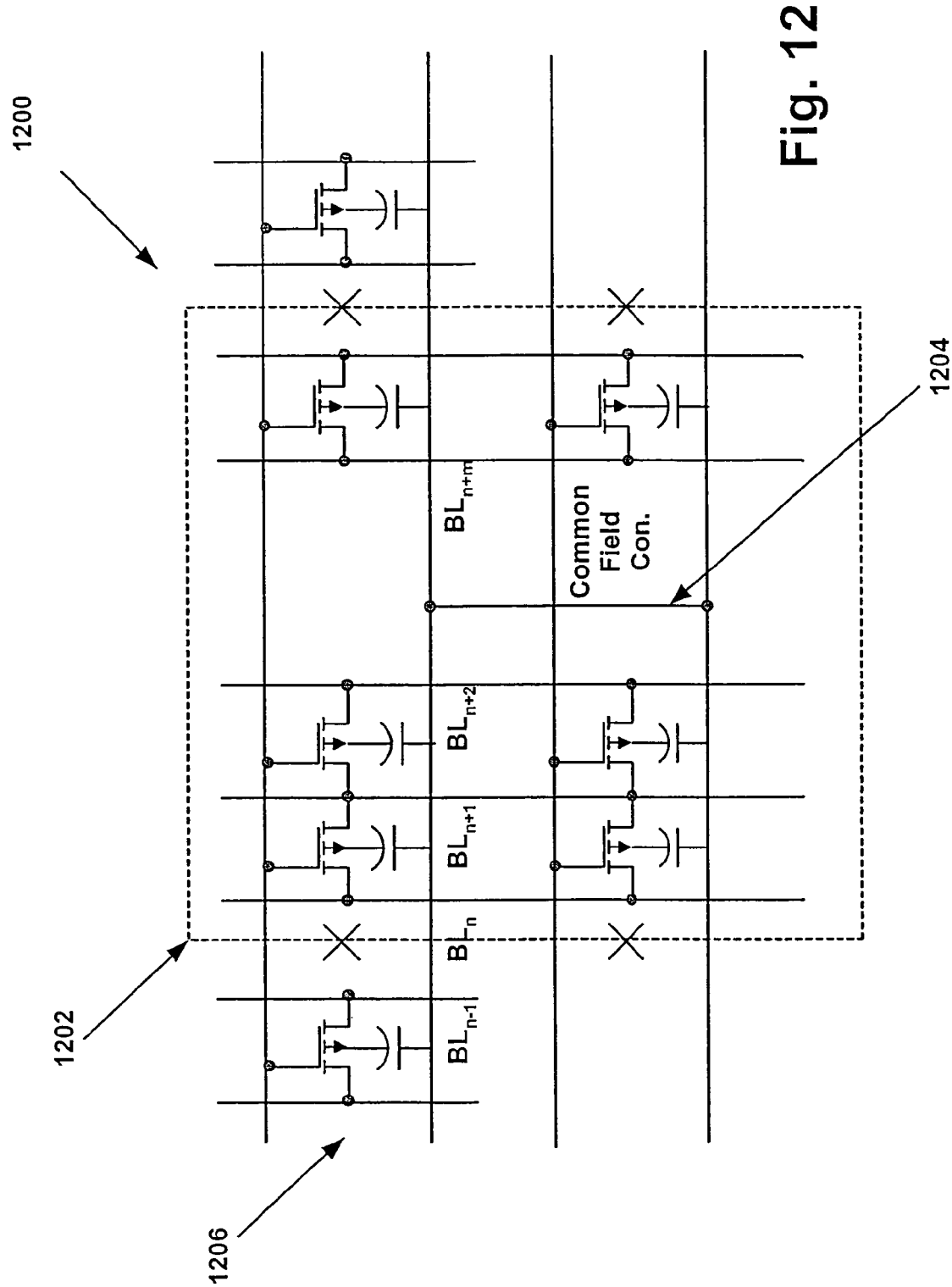
FIG. 12 illustrates a schematic diagram of another memory array structure employing polysilicon field conductors, in accordance with still yet another related embodiment.

FIG. 12 illustrates a schematic diagram of another memory array structure 1200 employing polysilicon field conductors 1204, in accordance with still yet another related embodiment. In use, only a portion of cells 1202 of each row may be written off, by having only corresponding bit lines low for a write off operation. Further, a region written off may include a group of cells with a shared polysilicon field conductor 1204.

At an end of the portion of cells 1202 (in a direction along a length of the word lines at the X), bit lines are connected to cells on one side only. In use, bit line $BL_n$ may be pulled down to a negative voltage for a write off operation; but this does not necessarily cause a write off operation for cell 1206 since bit line $BL_n-1$ may be at a higher voltage.

As yet a further option, selection devices may be positioned on each bit line segment in multiple levels. Each selection device connects a bit line segment on a level to a global bit line that is associated with more than one level of memory cell arrays. This may reduce the number of cells leaking to a global bit line node when sensing. Further, capacitance on the global bit line may be reduced, thus increasing performance during read operations. More information regarding the use of such global bit line and other related details will now be set forth in greater detail.

Checkerboard and Global Bit Line Arrangement Embodiment

Figure 13:
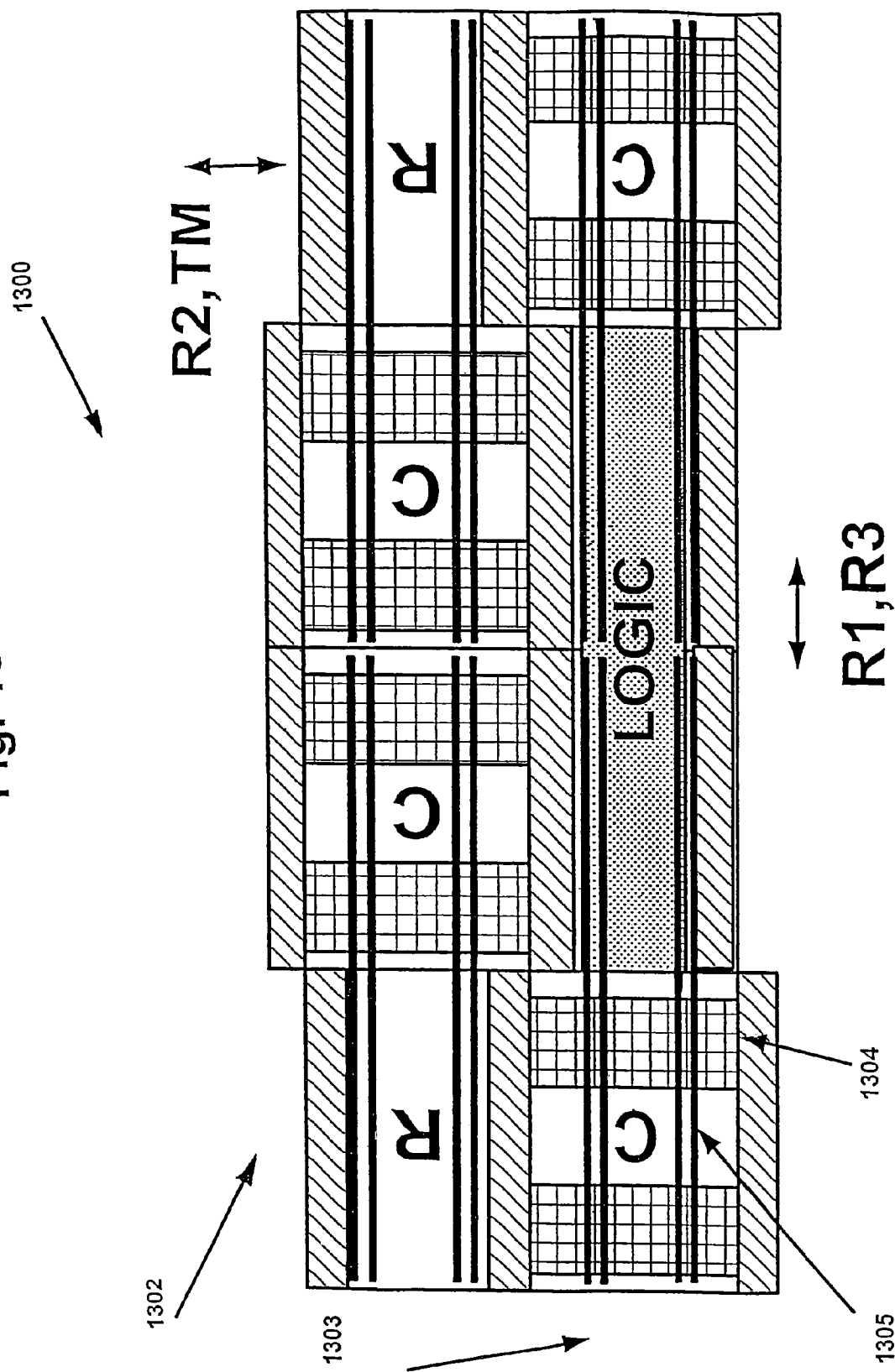
FIG. 13 illustrates memory array support circuitry in a checkerboard arrangement and equipped with global bit lines, in accordance with another embodiment.

FIG. 13 illustrates memory array support circuitry 1300 in a checkerboard arrangement and equipped with global bit lines, in accordance with another embodiment. As shown, such memory array support circuitry 1300 includes row decoder circuits 1302 and column decoder circuits 1303 arranged in a checkerboard pattern. Such memory array support circuitry 1300 may further be placed, to a great extent, under the array of memory cells. More exemplary information regarding the construction of such a checkerboard arrangement may be found by reference to U.S. Pat. No. 6,735,104, issued May 11, 2004, which is incorporated herein by reference in its entirety for all purposes.

As shown, the bit lines may be periodically connected by vertical contacts to bit line sensing and control circuitry 1304 by way of global bit line wiring 1305. The contacts may be separated by hundreds of cell pitches. Further, more than one level of bit lines may share the same vertical connections.

In some embodiments, vertical connections for bit lines may alternate with vertical connections for common bit lines, in order to reduce the opening of vertical connections at the periodic locations. In still other embodiments, the aforementioned global bit wiring 1305 may include a plurality of global lines positioned on at least one level of the array of memory cells. Further included is a respective plurality of switch devices which are adapted for coupling one or more of the bit lines to an associated global bit line.

More exemplary information regarding the construction and use of such global bit lines may be found by reference to U.S. Patent App. Publication No.: 2004/0188714, filed Mar. 31, 2003 (the Publication), which is incorporated herein by reference in its entirety for all purposes. For example, note FIGS. 3A and 3B of the Publication, where the charge storage gate device memory cells may replaced by TFT floating body dynamic memory cells. Further, note FIG. 5 of the Publication, where one transistor and one capacitor DRAM memory cells may be replaced by TFT floating body cells. Still yet, note FIG. 12 of the Publication, where the ROM cells may be replaced by TFT floating body cells.

Process-Related Embodiments

FIG. 14 illustrates a method 1400 for manufacturing an integrated circuit, in accordance with another embodiment. While various operations are set forth in the context of the present method 1400, it should be noted that numerous additional operations may be included as desired. Just by way of example, while the method 1400 initiates with operation 1402 below, it should be understood that many layers (possibly for constructing support circuitry) may be deposited on a substrate prior thereto. While the substrate may be constructed from any desired material, it may, in one embodiment, include monocrystalline silicon. Further, additional unillustrated operations may, of course, be employed as desired. Still yet, it should be noted that any desired type of memory cell (e.g. volatile memory cell) may be constructed utilizing the present method 1400.

As shown, in operation 1402, a bit line film is deposited, after which a plurality of bit lines is formed in operation 1404, by way of various processing techniques (e.g. filling with a dielectric, etching). Thereafter in operation 1406, a planarization operation (e.g. CMP) may be performed to form a planarized surface substantially coincident with the top of the bit lines. Next, in operation 1408, a channel region is deposited on the planarized surface and the bit lines, where the channel region defines an upper layer. In operation 1410, a word line is deposited on the upper layer, after which a plurality of word lines are formed by processing the word line film and the channel region in operation 1412, by way of various processing techniques. In operation 1414, an insulating layer is formed and planarized. It should be noted that any memory cell-related components mentioned herein may optionally be constructed utilizing deposited material and various etching processes, if desired, and further be optionally formed on a planarized surface, using the techniques disclosed herein as well as any others.

To this end, in a three-dimensional embodiment, operations 1402-1414 may be repeated for forming a three-dimensional array of memory cells having more than one level of the word lines and/or more than one level of the bit lines, as described earlier. For example, the bit lines may be situated below the channel region of corresponding memory cells, etc.

Of course, numerous additional process-related operations may be employed, as desired. For example, a thin oxide associated with gates may range from ~5 nm to 15 nm. Further, n+ poly may be used for a gate in the context of a silicide stack. Still yet, in the context of one embodiment of memory cells including thin film transistors (TFTs), various optimizations may be utilized. For more information regarding such optional optimizations, reference may be made to U.S. patent application Ser. No. 10/334,649, filed Dec. 31, 2002, which is incorporated herein by reference in its entirety for all purposes.

Additional Embodiments

In some embodiments, mask data may be collected and stored in electronic form to produce an integrated circuit with any of the desired characteristics disclosed herein. Further, an integrated circuit with any of the desired characteristics disclosed herein (e.g. embodying the TFT FB memory cells) may be produced in the form of a memory integrated circuit. Further, such memory integrated circuit may be incorporated onto a memory card having a standard interface and a controller.

In still yet another embodiment, multiple types of memory arrays may be combined in a single monolithic integrated circuit. Just by way of example, DRAM or static random access memory (SRAM) may be positioned on a surface of a substrate surface (or above), and TFT floating body memory above the substrate. Still yet, a level of non-volatile or volatile rewritable or one time programmable memory cells may be positioned on or above the substrate, with TFT floating body memory above the substrate. Even still, different types of memory may be situated both on the same level above the substrate, but in different locations on the integrated circuit.

As mentioned previously, both two and three-dimensional arrays of memory cells are contemplated. In a three-dimensional array embodiment, such array of memory cells has more than one level of the word lines and/or more than one level of the bit lines. As a further option, the more than one level of bit lines and/or more than one level of word lines may be monolithically formed above a substrate in a monolithic three-dimensional memory array.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three-dimensional memory arrays.

The foregoing description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit, comprising:
    an array of memory cells including a plurality of word lines and a plurality of bit lines, where each memory cell includes a writeable floating body in a channel region thereof;
    wherein the bit lines are situated below the channel region of corresponding memory cells, and wherein the floating body and channel region are interposed between the word lines and the bit lines.

2. The integrated circuit as recited in claim 1, wherein the array of memory cells is a three-dimensional array having more than one level of the word lines and/or more than one level of the bit lines.

3. The integrated circuit as recited in claim 2, wherein support circuitry is positioned, at least in part, under the three-dimensional array of memory cells, and includes row decoder circuits and column decoder circuits arranged in a checkerboard pattern.

4. The integrated circuit as recited in claim 2, wherein a plurality of global bit lines is positioned on at least one level of the three-dimensional array of memory cells, and a respective plurality of switch devices are adapted for coupling one or more of the bit lines to an associated one of the global bit lines.

5. The integrated circuit as recited in claim 2, wherein at least one level of the word lines is used exclusively by a single level of the three-dimensional array of memory cells.

6. The integrated circuit as recited in claim 2, wherein at least one level of the bit lines is used exclusively by a single level of the three-dimensional array of memory cells.

7. The integrated circuit as recited in claim 2, wherein respective word lines are shared by a plurality of levels of the three-dimensional array of memory cells.

8. The integrated circuit as recited in claim 2, wherein respective bit lines are shared by a plurality of levels of the three-dimensional array of memory cells.

9. The integrated circuit as recited in claim 2, wherein respective bit lines and word lines are shared by a plurality of levels of the three-dimensional array of memory cells.

10. The integrated circuit as recited in claim 2, wherein more than one type of memory cells is included in the three-dimensional array of memory cells.

11. The integrated circuit as recited in claim 2, wherein the bit lines include a common bit line that is determined as a function of a selection of one of the memory cells.

12. The integrated circuit as recited in claim 2, wherein the memory cells are situated at each of a plurality of intersections of the bit lines and the word lines.

13. The integrated circuit as recited in claim 12, wherein the memory cells are situated on each side of the bit lines.

14. The integrated circuit as recited in claim 1, wherein the channel region of at least a portion of the memory cells is removed prior to a corresponding word line being formed.

15. The integrated circuit as recited in claim 1, wherein the integrated circuit is a memory integrated circuit.

16. The integrated circuit as recited in claim 15, wherein the memory integrated circuit is incorporated on a memory card.

17. The integrated circuit as recited in claim 16, wherein the memory integrated circuit is incorporated on the memory card with a memory controller.

18. The integrated circuit as recited in claim 1, wherein the memory cells include thin-film transistors (TFTs).

19. The integrated circuit as recited in claim 1, wherein the word lines and the bit lines are perpendicular with respect to each other.

20. The integrated circuit as recited in claim 1, wherein each memory cell is volatile memory.

21. The integrated circuit as recited in claim 1, wherein each memory cell includes a re-writeable floating body.

22. The integrated circuit as recited in claim 1, wherein the channel region is formed on a planarized surface.

23. The integrated circuit as recited in claim 1, wherein the floating body includes a deposited material.

24. An integrated circuit, comprising:
an array of memory cells including a plurality of word lines and a plurality of bit lines, where each memory cell includes a writeable floating body in a channel region thereof;
wherein the bit lines are situated below the channel region of corresponding memory cells, and
wherein a polysilicon field conductor is situated between at least a portion of the bit lines.

25. An integrated circuit, comprising:
an array of memory cells including a plurality of word lines and a plurality of bit lines, where each memory cell includes a writeable floating body in a channel region thereof;
wherein the bit lines are situated below the channel region of corresponding memory cells, and
wherein a polysilicon field conductor is situated between at least a portion of the word lines.

* * * * *

UNITED STATES PATENT AND TRADEMARK OFFICE
CERTIFICATE OF CORRECTION

PATENT NO. : 7,830,722 B2
APPLICATION NO. : 11/923713
DATED : November 9, 2010
INVENTOR(S) : Roy E. Scheuerlein It is certified that error appears in the above-identified patent and that said Letters Patent is hereby corrected as shown below:

Cover page, FOREIGN PATENT DOCUMENTS, "WO 2004/090905 10/2001" should be changed to "WO 2004/090905 10/2004"

Page 2, OTHER PUBLICATIONS, please add "Supplemental Notice of Allowance of related U.S. Appl. No. 11/175,293 mailed Jun. 22, 2010"

Signed and Sealed this
Twenty-second Day of February, 2011

David J. Kappos
*Director of the United States Patent and Trademark Office*